(12) United States Patent
Hsiao

(10) Patent No.: US 6,815,337 B1
(45) Date of Patent: Nov. 9, 2004

(54) METHOD TO IMPROVE BORDERLESS METAL LINE PROCESS WINDOW FOR SUB-MICRON DESIGNS

(75) Inventor: Hsi Mao Hsiao, Hsin-Chu (TW)

(73) Assignee: Episil Technologies, Inc., Hsin-Chu (TW)

( * ) Notice: Subject to any disclaimer, the term of this patent is extended or adjusted under 35 U.S.C. 154(b) by 0 days.

(21) Appl. No.: 10/781,022

(22) Filed: Feb. 17, 2004

(51) Int. Cl.[7] .......................................... H01L 21/4763
(52) U.S. Cl. ...................... 438/628; 438/637; 438/639; 438/644; 438/654; 438/666; 438/669; 438/671; 438/685; 438/687; 438/688; 438/720; 438/734; 438/742
(58) Field of Search ................................. 438/628, 637, 438/639–640, 644, 654, 666, 669, 671, 685, 687–688, 720, 734, 742

(56) References Cited

U.S. PATENT DOCUMENTS

| | | | |
|---|---|---|---|
| 5,578,166 A | | 11/1996 | Hirota ..................... 156/643.1 |
| 5,593,919 A | * | 1/1997 | Lee et al. .................... 438/626 |
| 5,691,240 A | * | 11/1997 | Yang .......................... 438/626 |
| 5,756,396 A | * | 5/1998 | Lee et al. .................... 438/622 |
| 5,880,015 A | | 3/1999 | Hata .......................... 438/585 |
| 5,937,326 A | | 8/1999 | Cho ........................... 438/669 |
| 6,057,230 A | | 5/2000 | Liu ............................ 438/637 |
| 6,077,770 A | | 6/2000 | Hsu ........................... 438/622 |
| 6,228,757 B1 | * | 5/2001 | Sengupta et al. ........... 438/622 |
| 6,448,649 B1 | * | 9/2002 | Lee et al. .................... 257/758 |
| 6,451,691 B2 | * | 9/2002 | Song et al. ................. 438/653 |
| 6,544,871 B1 | * | 4/2003 | Honeycutt ................... 438/586 |
| 6,690,093 B2 | * | 2/2004 | Ahn et al. ................... 257/774 |
| 6,709,926 B2 | * | 3/2004 | Chidambarrao et al. .... 438/258 |
| 2002/0025664 A1 | * | 2/2002 | Wakejima et al. ........... 438/585 |
| 2002/0064934 A1 | * | 5/2002 | Deboer et al. .............. 438/622 |
| 2002/0074665 A1 | * | 6/2002 | Ahn et al. ................... 257/774 |
| 2002/0127844 A1 | * | 9/2002 | Grill et al. .................. 438/622 |

* cited by examiner

Primary Examiner—Lynne A. Gurley
(74) Attorney, Agent, or Firm—George O. Saile; Stephen B. Ackerman

(57) ABSTRACT

A process for reducing the risk of removing metal from an underlying metal structure during a dry etch procedure used to define a borderless, overlying metal line structure, has been developed. After formation of a damascene type, underlying metal structure, deposition of an metal layer and of an overlying silicon oxide layer, is performed. A photoresist shape is used as an etch mask to allow formation of a partially etched metal line structure to be accomplished in the silicon oxide layer, and in a top portion of the metal layer. Insulator spacers are then formed on the sides of the partially etched metal line structure, resulting in a wider, partially etched metal line structure. The hard mask now presented by the defined silicon oxide component of the partially etched metal line structure, is then used as an etch mask allowing a final metal line structure, wider than the partially etched metal line structure, to be obtained. The wider, partially etched metal line structure, used as an etch mask for the final definition of the metal line structure, reduced the risk of exposing portions of underlying metal plug structure during this dry etch procedure thus preventing removal of this material during the definition of the final metal line structure.

27 Claims, 3 Drawing Sheets

METHOD TO IMPROVE BORDERLESS METAL LINE PROCESS WINDOW FOR SUB-MICRON DESIGNS

BACKGROUND OF THE INVENTION (1) Field of the Invention

The present invention relates to methods used to fabricate semiconductor devices, and more specifically to a method used to form a borderless contact for a metal line structure overlying and contacting an underlying metal via structure.

(2) Description of Prior Art

The advent of micro-miniaturization, or the ability to fabricate semiconductor devices with sub-micron features, has allowed the performance of semiconductor devices to be improved, while processing costs for semiconductor chips comprised with sub-micron features, has been reduced. The use of sub-micron features allow decreases in performance degrading, parasitic junction capacitances to be realized, while a greater number of smaller semiconductor chips can be obtained from a specific size starting semiconductor substrate, thus reducing the processing cost for a specific semiconductor chip. The smaller semiconductor chips still provide device densities equal to, or greater than, counterpart semiconductor chips, comprised with larger features.

In addition to the use of sub-micron features specific design options, such as the use of borderless metal contact and line structures, have been used to reduce the size of semiconductor chips, thus again reducing the fabrication cost for a specific semiconductor chip. The borderless design allows for a non-fully landed metal structure to overlay and contact an underlying conductive region such as an underlying metal via, or metal interconnect structure. The luxury of not having to completely land on the underlying conductive region reduces the area of the underlying conductive region provided for contact by a subsequent overlying metal structure, thus allowing reductions of semiconductor chip size to be achieved. However the use of borderless designs can present problems when defining, via dry etching procedures, the overlying metal structure, specifically when a portion of the underlying metal structure is exposed to the final cycle of the overlying metal structure definition procedure, either by design or by mis-alignment. The non-selective definition, or dry etching procedure can result in unwanted removal of exposed underlying metal, specifically during an over etch cycle used to insure complete removal of the metal used for the overlying metal line or structure.

This invention will describe a novel process sequence in which the chance of exposure of the underlying metal structure to the dry etch procedure used to define a borderlsss, overlying metal structure, via mis-alignment or via intentional design ground rules, is reduced. This is accomplished by increasing the horizontal dimensions of the overlying, partially defined metal structure via formation of insulator spacers on the sides of a partially defined overlying metal structure, prior to completion of the definition procedure. The additional length or width of the overlying, partially defined overlying metal structure, provided by the insulator spacers, can protect previously exposed portions of the underlying metal structure from over etch cycles applied during the definition of the overlying metal structure. Prior art such as Hsu, in U.S. Pat. No. 6,077,770, describes a process of forming a damascene type, borderless metal interconnect structure, however that prior art does not describe the novel procedure detailed in the present invention in which insulator spacers are formed on a partially defined metal structure, than used as an etch mask to finalize the definition of the borderless metal interconnect structure.

SUMMARY OF THE INVENTION

It is an object of this invention to define an overlying metal structure on an underlying metal structure, without exposing the underlying metal structure to a dry etch procedure used to define the overlying metal structure.

It is another object of this invention to use a photoresist shape as an etch mask to define a partially defined metal structure in an insulator layer and in a top portion of a metal layer.

It is still another object of this invention to form spacers on the sides of the partially defined metal structure.

It is still yet another object of this invention to complete the definition of the overlying metal structure using the hard mask, comprised of the insulator shape on the partially defined metal structure, and the spacers on the sides of the partially defined metal structure, as the defining mask for the final metal structure shape.

In accordance with the present invention a method of defining an overlying metal structure on an underlying metal structure, with a reduced risk of exposing the underlying metal structure to the overlying metal structure definition process, via mis-alignment or intentional design, is described. After definition of an damascene type, underlying metal structure formed in an interlevel, or intermetal dielectric layer, a metal layer and an overlying, thin insulator layer are deposited. A photoresist shape is used as a mask to allow a dry etch procedure to define a shape in the thin insulator layer, and in a top portion of the metal layer. After removal of the photoresist shape, insulator spacers are formed on the exposed sides of the partially defined metal shape. The partially defined metal shape, overlaid with the thin insulator layer, and comprised with insulator spacers, are then used as an etch mask to complete the definition of a metal structure, which overlays, and contacts the underlying metal structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
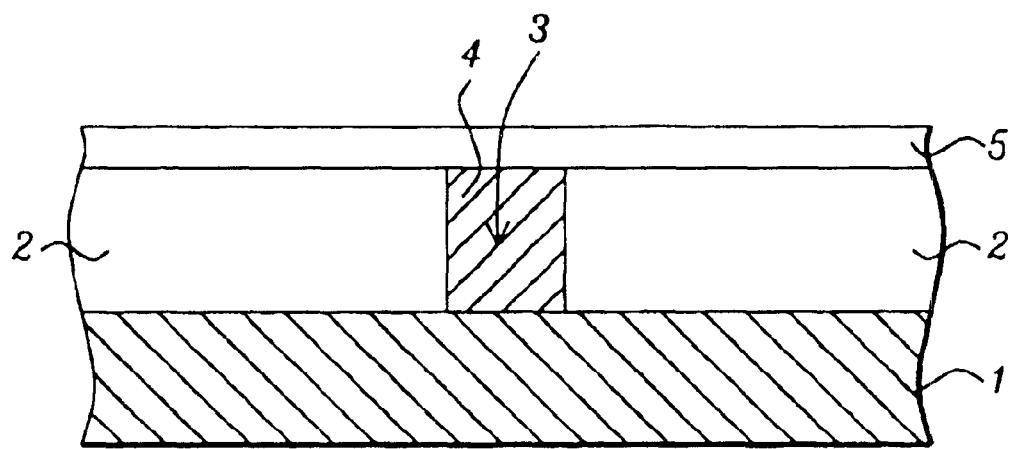
FIGS. 1–6, which schematically, in cross-sectional style, detail key stages of fabrication used to define an overlying metal structure on an underlying metal structure, with a reduced risk of exposure of the underlying metal structure to the procedure used to define the overlying metal structure.

The process used to define an overlying metal structure on an underlying metal structure, with a reduced risk of exposure of the underlying metal structure to the procedure used to define the overlying metal structure, will now be described in detail. Conductive region 1, comprised of an underlying metal interconnect structure, or an active device region such as a source/drain region in a semiconductor substrate, is provided and schematically shown in FIG. 1. Interlevel dielectric (ILD), layer 2, comprised of silicon oxide or boro-phosphosilicate glass (BPSG), is formed on conductive region 1, via low pressure chemical vapor deposition (LPCVD), or via plasma enhanced chemical vapor deposition (PECVD), procedures, at a thickness between about 4,000 to 10,000 Angstroms. If desired a planarization procedure comprised of a chemical mechanical polishing (CMP), process can be used to create a smooth top surface topography for ILD layer 2. Photolithographic and reactive ion etching (RIE), procedures, using $CHF_3$ as an etchant, are used to define opening 3, in ILD layer 2, exposing a portion of the top surface of conductive region 1. Opening 3, is comprised with a diameter between about 0.2 to 1.2 um. After removal of the photoresist shape used for definition of opening 3, a metal layer such as aluminum, aluminum-copper, copper, or tungsten, is deposited via plasma vapor deposition (PVD), or via chemical vapor deposition (CVD), procedures, to a thickness between about 5,000 to 10,000 Angstroms, completely filling opening 3. Unwanted portions of the metal layer, residing on the top surface of ILD layer 2, are removed via CMP or via a selective RIE procedure using $Cl_2$ as an etchant, resulting in metal plug structure 4, located in opening 3. Adhesive metal layer 5, comprised of a metal such as titanium layer, is next deposited via PVD procedures at a thickness between about 500 to 2,000 Angstroms, overlying and contacting the top surface of metal plug structure 4. Adhesive metal layer 5, will allow improved adhesion of a subsequent overlying metal line structure to underlying metal plug structure 4, to be realized. The result of these procedures is schematically shown in FIG. 1.

Figure 2:
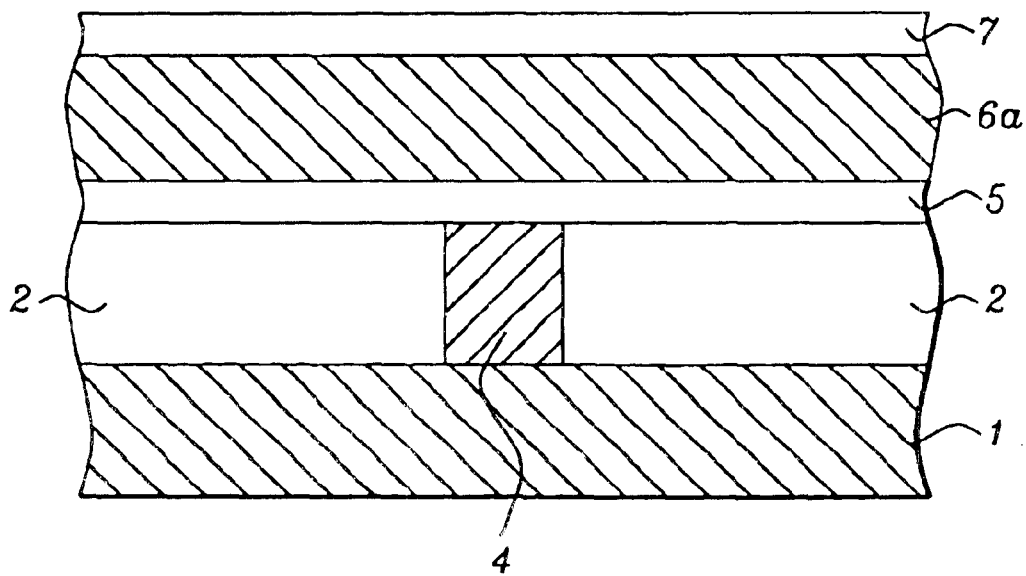

Metal layer 6a, comprised of either aluminum, aluminum-copper, copper, or tungsten, is next deposited via PVD procedures at a thickness between about 5,500 to 6,500 Angstroms, followed by the deposition of silicon oxide layer 7, via PECVD procedures, to a thickness between about 1,500 to 2,500 Angstroms. This is schematically shown in FIG. 2. Definition of an overlying metal line or metal via structure formed from metal layer 6a, is next addressed, with the subsequent, overlying metal structure being a borderless structure, or a structure that does not have to be fully landed on underlying metal plug structure 4. The design needed to insure a subsequent, fully landed overlying metal structure, would entail either a larger diameter, underlying metal plug structure or a narrower overlying metal line, or for the case in which the diameter of the metal plug structure and width of the overlying metal line are equal, perfect alignment would be required. Since increasing the diameter of the metal plug structure deleteriously impacts device density, and the narrower of the overlying metal line deleteriously impacts performance by increasing metal line resistance, and perfect alignment can not be guaranteed, a borderless, or non-fully landed, overlying metal line or structure is used.

Figure 3:
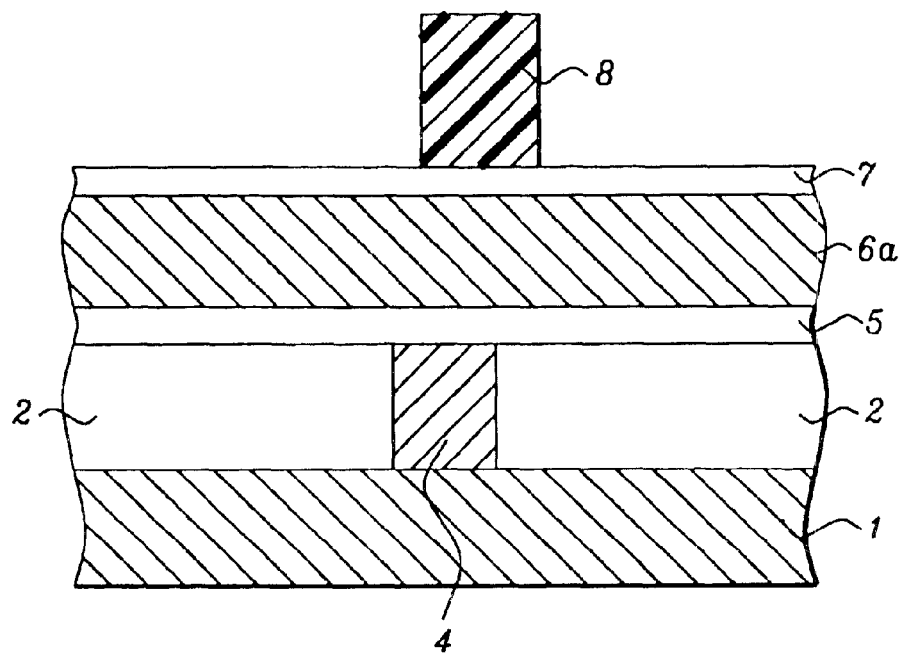

The procedure used to form a borderless metal line, with spacers formed on the sides of the metal line, reducing the risk of etching exposed portions of underlying metal plug structure 4, during definition of the metal line structure, is now initiated with the formation of photoresist shape 8, on the top surface of silicon oxide layer 7. The diameter or width of photoresist shape 8, shown schematically in FIG. 3, is between about 0.2 to 1.2 um, and thus if perfect alignment of photoresist shape to underlying metal plug structure 4, is not obtained, the process becomes a borderless process, where the definition of the overlying metal line structure can result in removal of exposed regions of metal plug structure 4, during an over etch cycle used at the conclusion of the definition procedure for the overlying metal line structure.

A first anisotropic RIE procedure is now employed, using $CHF_3$ as an etchant to remove portions of silicon oxide layer 7, not protected by photoresist shape 8. At the appearance of the top surface of metal layer 6a, the etch chemistry of the first anisotropic RIE procedure is changed to a $Cl_2$ or $SF_6$ chemistry, resulting in the removal of a top portion of metal layer 6a. Between about 2,000 to 3,000 Angstroms of a top portion of metal layer 6a, not protected by photoresist shape 8, is removed resulting in partially defined metal line structure 6b, schematically shown in FIG. 4. After removal of the top portion of exposed metal layer 6a, photoresist shape is removed via plasma oxygen ashing procedures.

Figure 4:
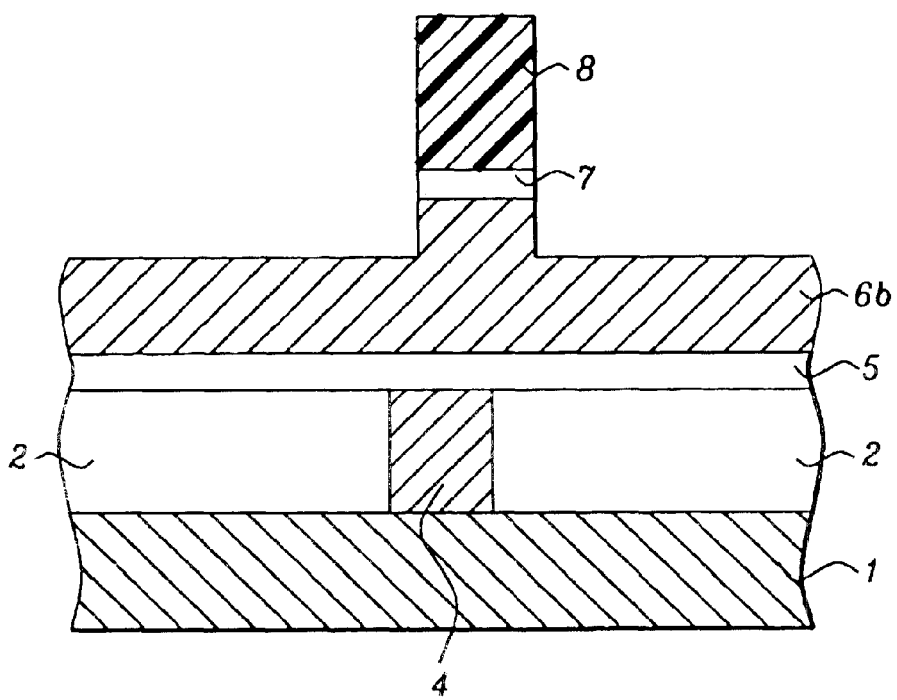
Figure 5:
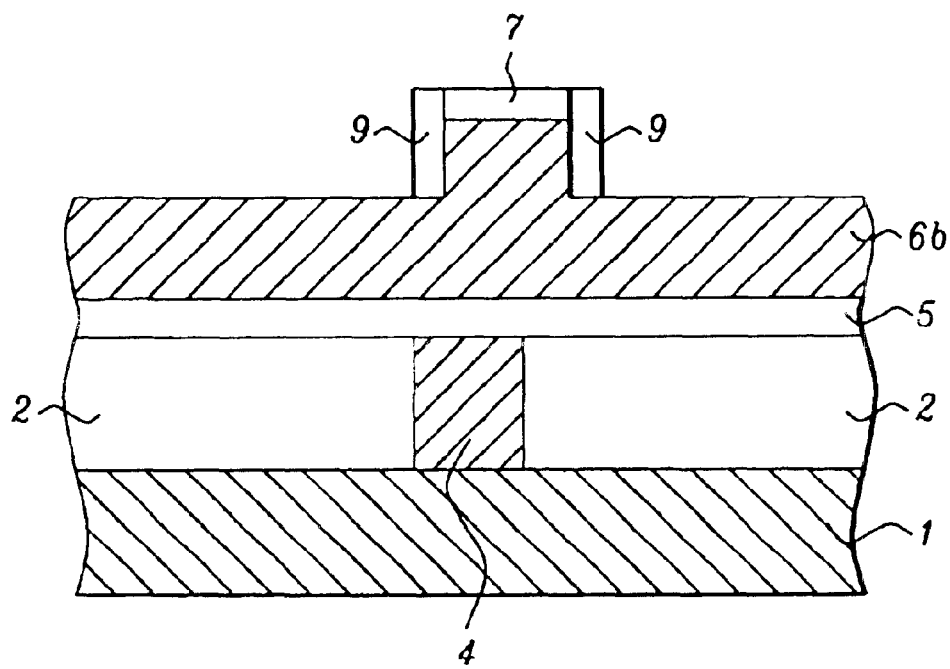

The example shown in FIG. 4, shows non-perfect alignment of photoresist 8, to metal plug structure 4, so if the definition process were now continued though titanium layer 5, portions of metal plug structure 4, would be exposed to the overlying metal line structure definition procedure. To reduce the chance of this exposure, due to non-perfect alignment, with the use of the borderless metal line structure design, insulator spacers 9, are formed on the sides of partially etched metal line structure 6b, increasing the width of the partially etched metal line structure. This is accomplished via deposition of an insulator layer such as silicon oxide, via LPCVD or PECVD procedures, at a thickness between about 350 to 450 Angstroms, using tetraethylorthosilicate (TEOS) as a source. If desired the insulator layer can be comprised of silicon nitride. A second anisotropic RIE procedure, using $CHF_3$ as an etchant for silicon oxide, is used to selectively form insulator spacers 9, on the sides of the partially etched metal line structure 6b. The width of partially etched metal line structure 6b, has now been increased by between about 700 to 900 Angstroms. An over etch cycle used to unsure complete removal of the insulator layer from the horizontal surfaces of partially etched metal line structure 6b, reduces the thickness of insulator 7, located on the unetched portion of partially etched metal line structure 6b, to between about 1,000 to 1,500 Angstroms. This is schematically shown in FIG. 5. The increased dimension, or width of partially etched metal line structure 6b, will reduce the risk of exposure of underlying metal plug structure 4, during the final definition procedure of the overlying metal line structure, when a hard mask comprised of partially etched metal line structure 6b, overlaid with silicon oxide layer 7, is to be used as an etch mask during the final definition procedure.

Figure 6:
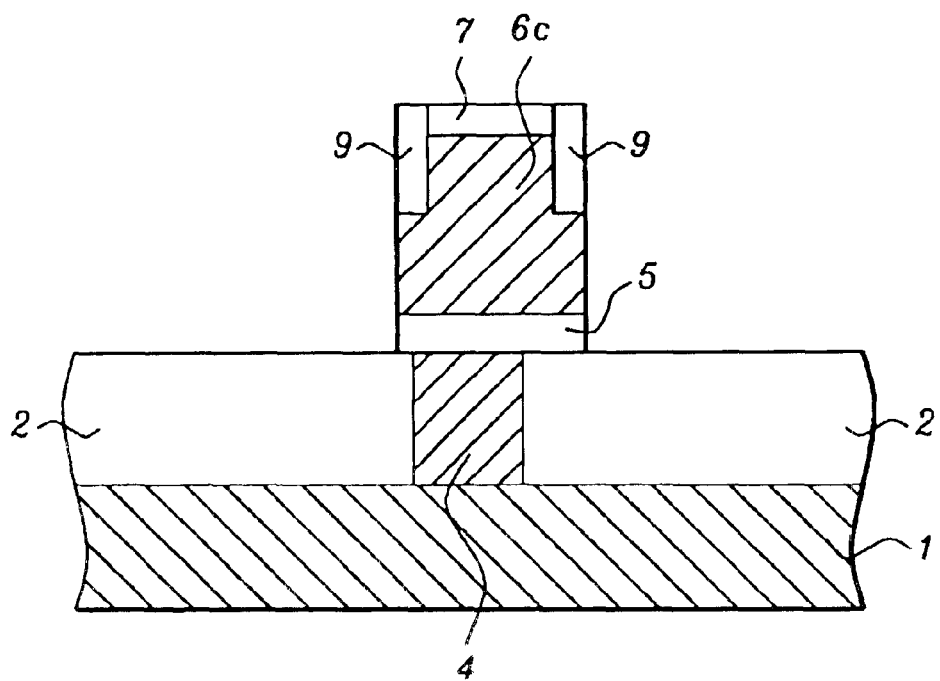

A third anisotropic RIE procedure, again using $Cl_2$ as an etchant, is used to selectively remove the bottom portions of partially etched metal line structure 6b, and to selectively remove the exposed portions of titanium layer 5, not protected by the hard mask comprised of partially etched metal line structure 6b, overlaid with silicon oxide layer 7, and comprised with insulator spacers 9, resulting in final metal line structure 6c. This is schematically shown in FIG. 6. The selective RIE procedure is terminated at the appearance of the top surface of ILD layer 2. The additional width of final metal line structure 6c, provided by insulator spacers 9, allowed non-perfect alignment, or mis-alignment of final metal line structure 6c, to underlying metal plug structure 4, to be tolerated without etching of exposed regions of underlying metal plug structure 4. Therefore the additional width of final metal line structure 6c, allowed an needed over etch cycle to be employed at the conclusion of the final metal line structure definition procedure, insuring complete removal of metal layer 6a, and titanium layer 7, even in areas where thicker layers may have been present.

While this invention has been particularly shown and described with reference to the preferred embodiments thereof, it will be understood by those skilled in the art that various changes in form and details may be made without departing from the spirit and scope of this invention.

What is claimed is:

1. A method of forming a second metal structure, overlying and contacting an underlying first metal structure, comprising the steps of:

forming an opening in an interlevel dielectric (ILD) layer;

forming said first metal structure in said opening in said ILD layer;

depositing a first metal layer, to be used as an adhesive metal layer;

depositing a second metal layer;

depositing an insulator layer;

forming a photoresist shape on said insulator layer, with said photoresist shape overlying a portion of underlying, said first metal structure;

performing a first dry etch procedure to remove a region of said insulator layer, and to remove a top portion of said second metal, not covered by said photoresist shape, creating a partially etched metal structure comprised with an overlying portion of unetched insulator layer;

removing said photoresist shape;

forming insulator spacers on sides of partially etched metal structure, resulting in a wider partially etched metal structure; and using said wider partially etched metal structure as an etch mask, performing a second dry etch procedure removing an exposed bottom portion of said second metal layer, and removing an exposed portion of said first metal layer, resulting in definition of said second metal structure, with said second metal structure completely covering underlying, said first metal structure.

2. The method of claim 1, wherein said interlevel dielectric (ILD) layer is a silicon oxide, or boro-phosphosilicate glass (BPSG) layer, obtained via LPCVD or PECVD procedures at a thickness between about 4,000 to 10,000 Angstroms.

3. The method of claim 1, wherein said opening, in said ILD layer, is comprised with a diameter between about 0.2 to 1.2 um.

4. The method of claim 1, wherein said first metal structure is a metal plug structure, comprised of a metal chosen from a group containing aluminum, aluminum-copper, copper, or tungsten.

5. The method of claim 1, wherein said first metal layer, used as said adhesive metal layer, is a titanium layer, obtained via plasma vapor deposition (PVD) procedures at a thickness between about 500 to 2,000 Angstroms.

6. The method of claim 1, wherein said second metal layer is chosen from a group containing aluminum, aluminum-copper, copper, or tungsten, obtained via PVD procedures at a thickness between about 5,500 to 6,500 Angstroms.

7. The method of claim 1, wherein said insulator layer is a silicon oxide layer obtained via PECVD procedures at a thickness between about 1,500 to 2,500 Angstroms, using tetraethylorthosilicate (TEOS) as a source.

8. The method of claim 1, wherein said photoresist shape is comprised with a width between about 0.2 to 1.2 um.

9. The method of claim 1, wherein said first dry etch procedure, used to form said partially etched metal structure, is performed using an anisotropic RIE procedure, employing $CHF_3$ as an etchant for said insulator layer, and using $Cl_2$ or $SF_6$ as an etchant for said top portion of said second metal layer.

10. The method of claim 1, wherein the thickness of said top portion of said second metal layer removed during said first dry etch procedure is between about 2,000 to 3,000 Angstroms.

11. The method of claim 1, wherein said insulator spacers are silicon oxide spacers, formed at a thickness between about 350 to 450 Angstroms, via deposition of a silicon oxide layer, using LPCVD or PECVD procedures, than defined via a selective, anisotropic RIE procedure, using $CHF_3$ as an etchant for silicon oxide.

12. The method of claim 1, wherein said wider partially etched metal structure is between about 700 to 900 Angstroms wider than the width of said partially etched metal structure.

13. The method of claim 1, wherein said second dry etch procedure used to define said second metal structure, is an anisotropic RIE procedure using $Cl_2$ or $SF_6$ as an etchant for said bottom portion of said second metal layer and for said first metal layer.

14. A method of forming a metal line structure featuring insulator spacers formed on a top portion of a partially defined metal line structure, used to reduce the risk of exposing an underlying metal plug structure to final stages of a dry etch procedure used to define said metal line structure, comprising the steps of:

providing a conductive region;

forming an ILD layer on said conductive region;

forming an opening in said ILD layer exposing a portion of top surface of said conductive region;

depositing a first metal layer;

removing a portion of said first metal layer from top surface of said ILD layer resulting in formation of said metal plug structure in said opening;

depositing a titanium layer;

depositing a second metal layer;

depositing a silicon oxide layer;

forming a photoresist shape on said silicon oxide layer, with said photoresist shape overlying a portion of, or all of underlying, said metal plug structure;

performing a first anisotropic reactive ion etch (RIE) procedure to remove the region of said silicon oxide layer and to remove of a top portion of a region of said second metal, not covered by said photoresist shape, creating a partially etched metal line structure, comprised with an overlying, etched silicon oxide shape;

depositing an insulator layer;

performing a second anisotropic RIE procedure to form said insulator spacers on sides of said partially etched metal line structure, resulting in a wider partially etched metal line structure; and performing a third anisotropic RIE procedure, using said wider partially etched metal line structure as an etch mask, to remove an uncovered bottom portion of said second metal layer, and to remove an uncovered portion of said titanium layer, resulting in definition of said second metal line structure, with said second metal line structure completely covering underlying, said metal plug structure.

15. The method of claim 14, wherein said conductive region is an underlying metal structure, or an active device region in a semiconductor substrate, such as a heavily doped source/drain region.

16. The method of claim 14, wherein said ILD layer is a silicon oxide, or boro-phosphosilicate glass (BPSG) layer, obtained via LPCVD or PECVD procedures at a thickness between about 4,000 to 10,000 Angstroms.

17. The method of claim 14, wherein said opening, in said ILD layer, is comprised with a diameter between about 0.2 to 1.2 um.

18. The method of claim 14, wherein said metal plug structure, located in said opening in said ILD layer, is comprised with a metal chosen from a group containing aluminum, aluminum-copper, copper, or tungsten.

19. The method of claim 14, wherein said titanium layer is obtained via plasma vapor deposition (PVD) procedures at a thickness between about 500 to 2,000 Angstroms.

20. The method of claim 14, wherein said second metal layer is chosen from a group containing aluminum, aluminum-copper, copper, or tungsten, obtained via PVD procedures at a thickness between about 5,500 to 6,500 Angstroms.

21. The method of claim 14, wherein said silicon oxide layer is obtained via PECVD procedures at a thickness between about 1,500 to 2,500 Angstroms, using tetraethylorthosilicate (TEOS) as a source.

22. The method of claim 14, wherein said photoresist shape is comprised with a width between about 0.2 to 1.2 um.

23. The method of claim 14, wherein said first anisotropic RIE procedure, used to form said partially etched metal line structure, is performed using $CHF_3$ as an etchant for said silicon oxide layer, and using $Cl_2$ or $SF_6$ as an etchant for said top portion of said second metal layer.

24. The method of claim 14, wherein the thickness of said top portion of said second metal layer removed during said first anisotropic RIE procedure is between about 2,000 to 3,000 Angstroms.

25. The method of claim 14, wherein said insulator layer is a silicon oxide layer, obtained via PECVD procedures at a thickness between about 350 to 450 Angstroms, using TEOS as a source.

26. The method of claim 14, wherein said insulator spacers are defined using said second anisotropic RIE procedure, employing $CHF_3$ as an etchant for silicon oxide.

27. The method of claim 14, wherein said third anisotropic RIE procedure, used to define said metal line structure, is performed using $Cl_2$ or $SF_6$ as an etchant for said bottom portion of said second metal layer and for said titanium layer.

* * * * *